United States Patent
Kang

(10) Patent No.: US 7,333,377 B2
(45) Date of Patent: Feb. 19, 2008

(54) TEST MODE CONTROL DEVICE USING NONVOLATILE FERROELECTRIC MEMORY

(75) Inventor: Hee Bok Kang, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/702,223

(22) Filed: Feb. 5, 2007

(65) Prior Publication Data

US 2007/0133254 A1     Jun. 14, 2007

Related U.S. Application Data

(62) Division of application No. 10/730,134, filed on Dec. 9, 2003, now Pat. No. 7,190,606.

(30) Foreign Application Priority Data

Jan. 24, 2003  (KR)  ..................... 10-2003-0004826

(51) Int. Cl.
*G11C 7/00* (2006.01)
(52) U.S. Cl. ..................... 365/201; 365/145; 365/191; 365/194; 365/233.5
(58) Field of Classification Search ................ 365/145, 365/191, 194, 201, 233.5
See application file for complete search history.

(56) References Cited

U.S. PATENT DOCUMENTS

| | | | |
|---|---|---|---|
| 5,548,560 A | * | 8/1996 | Stephens et al. ......... 365/233.5 |
| 5,636,225 A | | 6/1997 | Osawa |
| 5,677,865 A | | 10/1997 | Seyyedy |
| 5,703,818 A | | 12/1997 | Osawa |
| 5,751,628 A | | 5/1998 | Hirano et al. |
| 5,959,922 A | | 9/1999 | Jung |
| 5,978,935 A | | 11/1999 | Kim et al. |
| 5,991,225 A | | 11/1999 | Forbes et al. |
| 6,055,200 A | | 4/2000 | Choi et al. |
| 6,067,244 A | | 5/2000 | Ma et al. |
| 6,286,116 B1 | | 9/2001 | Bhavsar |
| 6,301,145 B1 | | 10/2001 | Nishihara |
| 6,314,016 B1 | | 11/2001 | Takasu |
| 6,920,060 B2 | | 7/2005 | Chow et al. |

FOREIGN PATENT DOCUMENTS

KR    1020040059009 A    7/2004

* cited by examiner

*Primary Examiner*—Hoai V. Ho
(74) *Attorney, Agent, or Firm*—Townsend and Townsend and Crew LLP

(57) ABSTRACT

A test mode control device using a nonvolatile ferroelectric memory enables a precise test of characteristics of a memory cell array by changing a reference voltage and timing regulated for a memory cell test in a software system without extra processes. In an embodiment, test modes and arrangement of data pins are programmed using a nonvolatile ferroelectric memory, and addresses, control signals and arrangement of data pins are regulated in a software system depending on a programmed code. As a result, characteristics of a cell array can be precisely tested without extra processes.

5 Claims, 19 Drawing Sheets

TEST MODE CONTROL DEVICE USING NONVOLATILE FERROELECTRIC MEMORY

CORRESPONDING RELATED APPLICATION

This application is a Divisional of U.S. application Ser. No. 10/730,134 filed Dec. 9, 2003, now issued as U.S. Pat. No. 7,190,606 which claims priority to Korean Patent Application No. 10-2003-0004826 filed Jan. 24, 2003, which are hereby incorporated by reference in their entirety.

BACKGROUND OF THE INVENTION

1. Field of the Invention

The present invention generally relates to a test mode control device using a nonvolatile ferroelectric memory, and more specifically, to a technique for changing a reference voltage and timing regulated for memory cell test according to a command signal.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

An extra test mode set method is required in order to test characteristics of the conventional nonvolatile ferroelectric memory in various regions. That is, in order to test only characteristics of a cell array, a level of a sensing reference voltage is manually regulated from outside of a chip. Additionally, in order to analyze characteristics of the cell array quantitatively, the sensing reference voltage is set to have a predetermined level.

In order to set a sensing reference voltage level of the conventional nonvolatile ferroelectric memory, characteristics of the chip are evaluated by using additional masks. Then, the evaluation result is fed back, and masks of corresponding layers are changed, thereby embodying the chip.

However, additional masks and wafer processes are required to set the test mode, which results in loss of cost and time.

Meanwhile, in order to embody various package types in the test of nonvolatile ferroelectric memory, various types of pad arrangement structure are required. Also, additional physical masks and wafer processes are required to change the arrangement structure of pads when the test mode of memory is set.

In this package condition, separate mask sets for package type are required, which results in loss in cost and time. Therefor, the yield is degraded.

SUMMARY OF THE INVENTION

Accordingly, it is an object of the present invention to precisely test characteristics of a memory cell array by changing a reference voltage and timing regulated for memory cell test according to a command signal without any process.

In an embodiment, a test mode control device using a nonvolatile ferroelectric memory comprises a first reference voltage controller, a reference register unit, a path control means and a second reference voltage controller. The first reference voltage controller outputs a reference voltage control signal having a predetermined level of voltage in response to a reference input signal. The reference register unit programs a code to control a reference voltage in a nonvolatile ferroelectric memory, and outputs a register control signal including information on a test mode or normal operation mode depending on the programmed code. The path control means selectively outputs an external control signal inputted externally in the test mode in response to the register control signal, and selectively outputs the reference voltage control signal in the normal operation mode. The second reference voltage controller controls a voltage level of a reference voltage under the same condition with a cell array block in response to an output signal of the path control means.

In another embodiment, a test mode control device using a nonvolatile ferroelectric memory comprises a first timing controller, a timing control register unit, a path control means and a second timing controller. The first timing controller controls timing of an address transition detecting signal. The timing control register unit programs a code to control timing of a cell array block driving control signal in a nonvolatile ferroelectric memory, and outputs a register control signal including information on a test mode or normal operation mode depending on the programmed code. The path control means selectively outputs an external control signal inputted externally in the test mode in response to the register control signal, and selectively outputs an output signal from the first timing controller in the normal operation mode. The second timing controller controls timing of the cell array block driving control signal in response to an output signal from the path control means.

In still another embodiment, a test mode control device using a nonvolatile ferroelectric memory comprises a plurality of pads, a plurality of buffers, a pad register unit and a path control means. The plurality of pads receive a control signal and an address. The plurality of buffers buffer the control signal and the address inputted from the plurality of pads. The pad register unit programs a code for assignment of the control signal and the address inputted into the pad in a nonvolatile ferroelectric memory, and changes a connection path between the plurality of pads and the plurality of buffers depending on the programmed code. The path control means controls connection between the plurality of pads and the plurality of buffers in response to the register control signal.

DETAILED DESCRIPTION OF THE PREFERRED EMBODIMENTS

The present invention will be described in detail with reference to the accompanying drawings.

Figure 1:
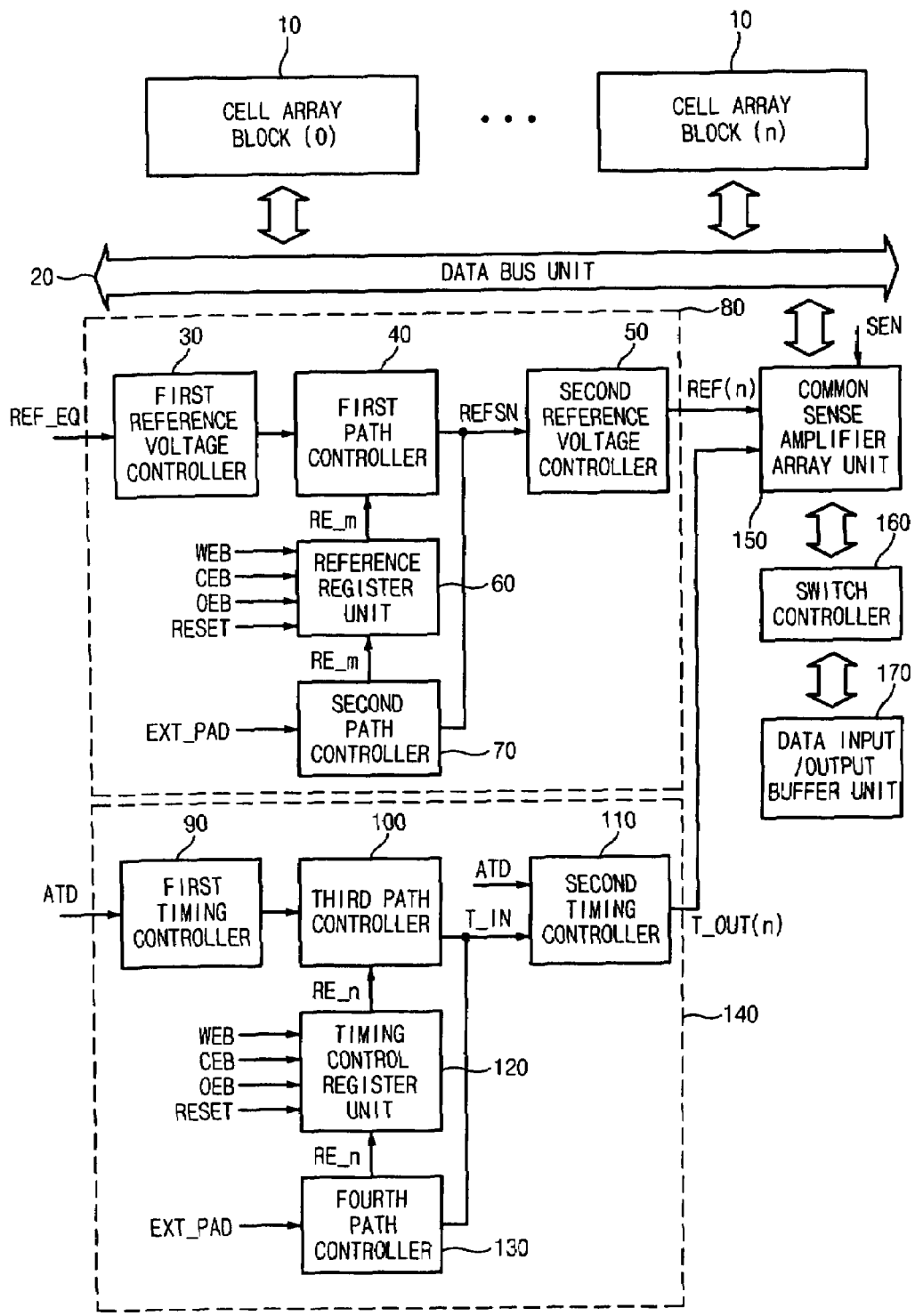
FIG. 1 is a block diagram illustrating a test mode control device using a nonvolatile ferroelectric memory according to an embodiment of the present invention.

FIG. 1 is a block diagram illustrating a test mode control device using a nonvolatile ferroelectric memory according to an embodiment of the present invention.

In an embodiment, the test mode control device comprises a plurality of cell array blocks 10, a data bus unit 20, a reference voltage controller 80, a timing controller 140, a common sense amplifier array unit 150, a switch controller 160 and a data input/output buffer unit 170.

The reference voltage controller 80 comprises a first reference voltage controller 30, a first path controller 40, a second reference voltage controller 50, a reference register unit 60 and a second path controller 70.

The plurality of cell array blocks 10 share the data bus unit 20 connected to the common sense amplifier array unit 150. The common sense amplifier array unit 150 is connected to the switch controller 160 connected to the data input/output buffer unit 170.

The reference register unit 60 outputs register control signals RE_m and REB_m in response to a write enable signal WEB, a chip enable signal CEB, an output enable signal OEB and a reset signal RESET.

The first reference voltage controller 30 controls a reference voltage in response to a reference input signal REF_EQ generated internally, and outputs the reference voltage into the first path controller 40. The first path controller 40 outputs a reference voltage control signal REFSN into the second reference voltage controller 50 in response to the reference control signal RE_m. The second path controller 70 outputs an external control signal EXT_PAD inputted from a pad into the second reference voltage controller 50 in response to the reference control signal REB_m.

The second reference voltage controller 50 controls the reference voltage control signal REFSN with a voltage having the same condition as that of the cell array block 10, and outputs a reference voltage REF(n) to control the common sense amplifier array unit 150.

The first path controller 40 has an opposite phase to the second path controller 70. When the first path controller 40 is activated, the second path controller 70 is inactivated. However, when the second path controller 70 is activated, the first path controller 40 is inactivated.

The timing controller 140 comprises a first timing controller 90, a third path controller 100, a second timing controller 110, a timing control register unit 120 and a fourth path controller 130.

The timing control register unit 120 outputs register control signals RE_n and REB_n in response to a write enable signal WEB, a chip enable signal CEB, an output enable signal OEB and a reset signal RESET.

The first timing controller 90 controls operation timing in response to an address transition detecting signal ATD generated internally, and outputs a timing control signal into the third path controller 100. The third path controller 100 outputs the timing control signal T_IN into the second timing controller 110 in response to the reference control signal RE_n. The fourth path controller 130 outputs an external control signal EXT_PAD inputted from a pad into the second timing controller 110 in response to the reference control signal REB_n.

The second timing controller 110 controls operation timing in response to the address transition detecting signal ATD, and selects an output signal from the third path controller 100 or the fourth path controller 130. Then, the second timing controller 110 outputs a timing control signal T_OUT into the common sense amplifier array unit 150.

The third path controller. 100 has an opposite phase to the fourth path controller 130. When the third path controller 100 is activated, the fourth path controller 130 is inactivated. However, when the fourth path controller 130 is activated, the third path controller 100 is inactivated.

Figure 2:
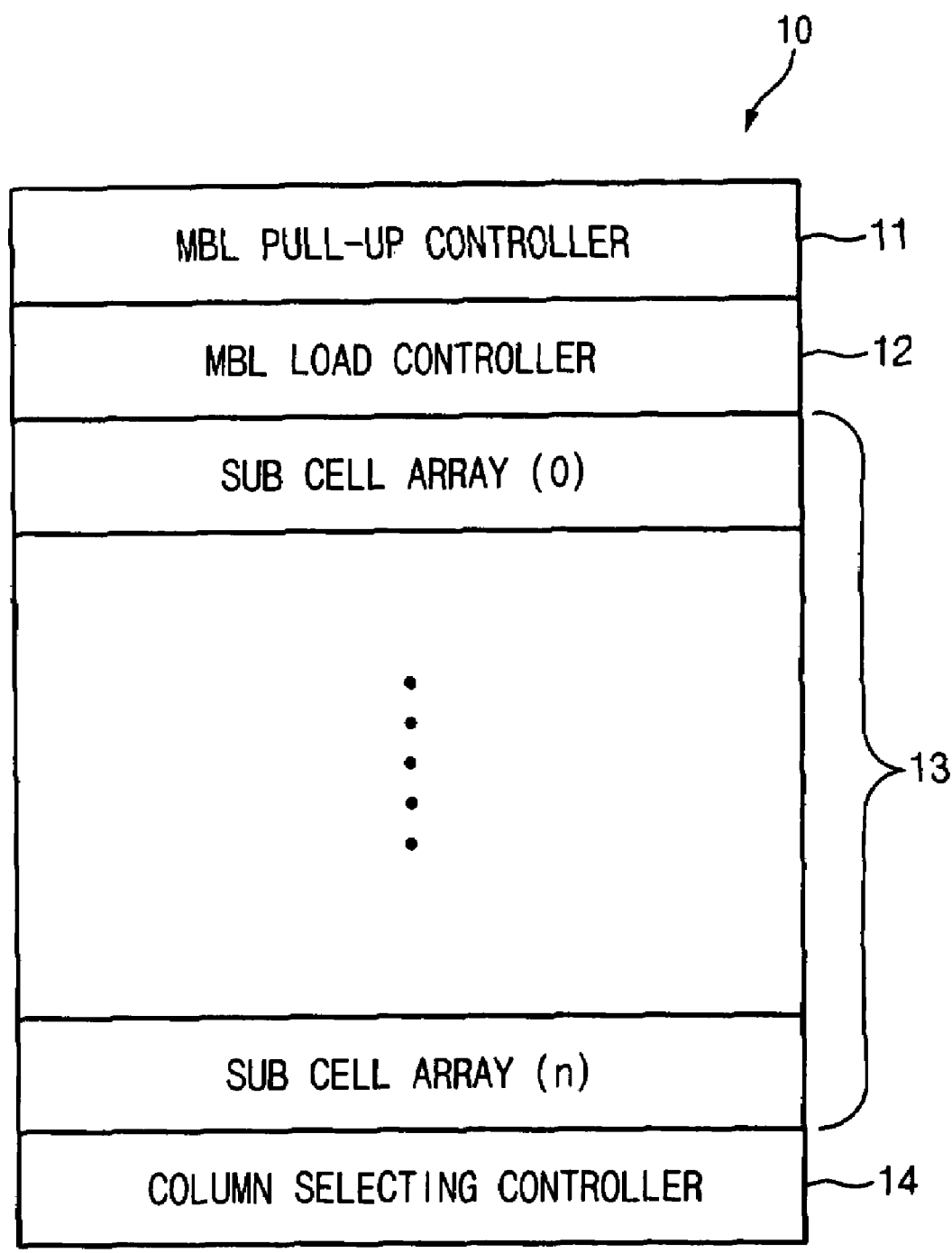
FIG. 2 is a diagram illustrating a cell array block of FIG. 1.

FIG. 2 is a diagram illustrating the cell array block 10 of FIG. 1.

The cell array block 10 comprises a MBL (Main Bitline) pull-up controller 11, a MBL load controller 12, a plurality of sub cell arrays 13 and a column selecting controller 14.

Figure 3:
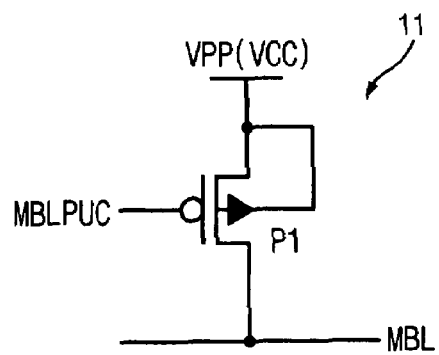
FIG. 3 is a circuit diagram illustrating a MBL pull-up controller of FIG. 2.

FIG. 3 is a circuit diagram illustrating the MBL pull-up controller 11 of FIG. 2.

The MBL pull-up controller 11 comprises a PMOS transistor P1 for pulling up a main bitline MBL in a precharge mode. The PMOS transistor P1 has a drain connected to a main bitline MBL, a source connected to a power voltage VPP (VCC) terminal and a gate to receive a main bitline pull-up control signal MBLPUC.

Figure 4:
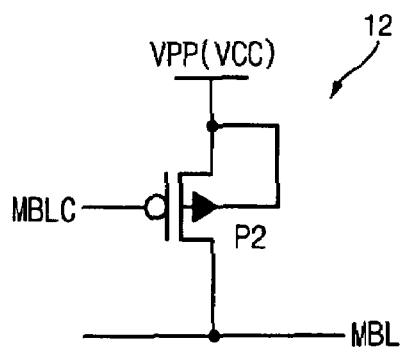
FIG. 4 is a circuit diagram illustrating a MBL load controller of FIG. 2.

FIG. 4 is a circuit diagram illustrating the MBL load controller 12 of FIG. 2.

The MBL load controller 12 comprises a PMOS transistor P2 to provide current to the main bitline MBL when data of a memory cell are sensed. The PMOS transistor P2 has a drain connected to the main bitline MBL, a source connected to the power voltage VPP (VCC) terminal and a gate to receive a main bitline load control signal MBLC.

Figure 5:
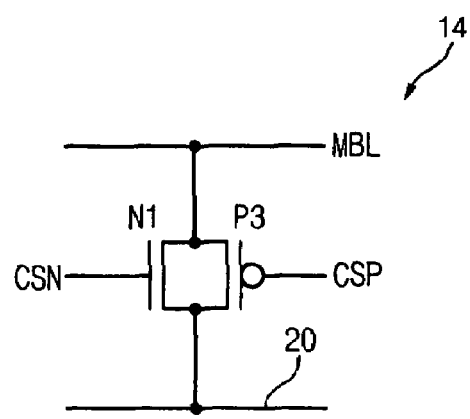
FIG. 5 is a circuit diagram illustrating a column selecting controller of FIG. 2.

FIG. 5 is a circuit diagram illustrating the column selecting controller 14 of FIG. 2.

The column selecting control unit 14 comprises a NMOS transistor N1 and a PMOS transistor P3 which are connected between the main bitline MBL and the data but unit 20. The NMOS transistor N1 has a gate to receive a column selecting signal CSN. The PMOS transistor P3 has a gate to receive a column selecting signal CSP. The column selecting signal CSN has an opposite phase to the column selecting signal CSP.

Figure 6:
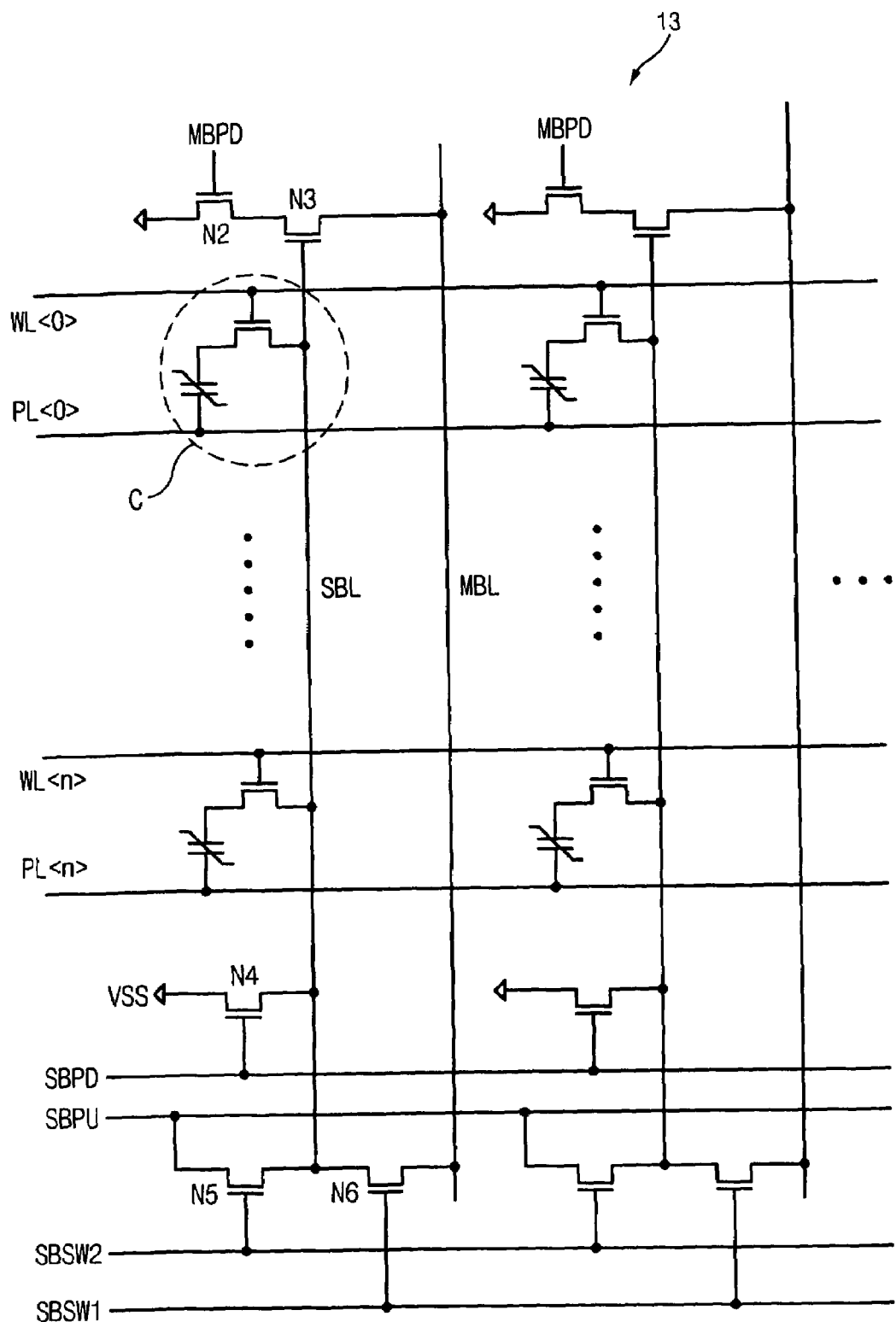
FIG. 6 is a circuit diagram illustrating a sub cell array of FIG. 2.

FIG. 6 is a circuit diagram illustrating the sub cell array 13 of FIG. 2.

Each main bitline MBL of the sub cell array 13 is selectively connected to one sub-bitline SBL among a plurality of sub-bitlines SBL. When a sub-bitline selecting signal SBSW1 is activated, an NMOS transistor N6 is turned on to activate one sub-bitline SBL. One sub-bitline SBL is connected to a plurality of cells C.

When a sub-bitline pull-down signal SBPD is activated, an NMOS transistor N4 is turned on to pull down the sub-bitline SBL to a ground level. A sub-bitline pull-up signal SBPU is to control power supplied to the sub-bitline SBL. That is, in a low voltage, a voltage higher than the power voltage VCC is supplied to the sub-bitline SBL.

A sub-bitline selecting signal SBSW2 controls connection between a sub-bitline SBPU terminal and the sub-bitline SBL depending on switching of an NMOS transistor N5.

An NMOS transistor N3, connected between an NMOS transistor N2 and the main bitline MBL, has a gate connected to the sub-bitline SBL. The NMOS transistor N2, connected between a ground voltage terminal and the NMOS transistor N3, has a gate to receive a main bitline pull-down signal MBPD, thereby regulating a sensing voltage of the main bitline MBL.

Figure 7:
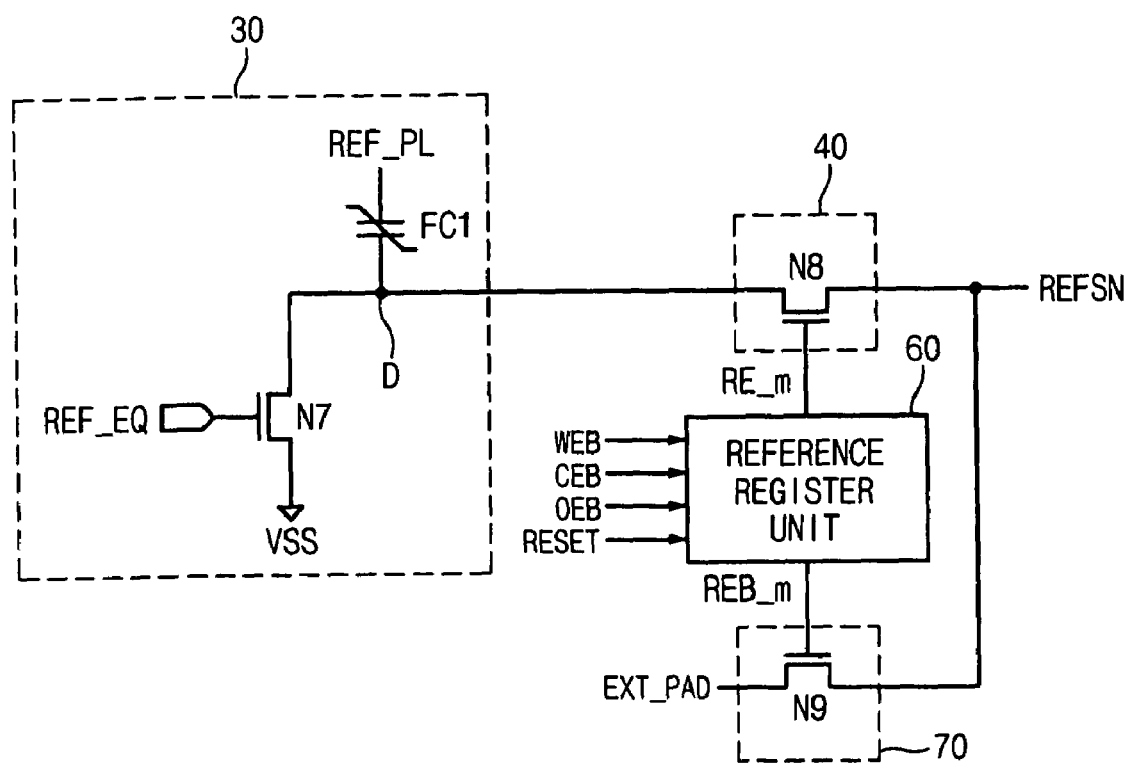
FIG. 7 is a circuit diagram illustrating a reference voltage controller of FIG. 1.

FIG. 7 is a circuit diagram illustrating the first reference voltage controller 30, the first path controller 40 and the second path controller 70 in the reference voltage controller 80 of FIG. 1.

The first reference voltage controller 30 comprises an NMOS transistor N7 and a nonvolatile ferroelectric capacitor FC1.

The NMOS transistor N7, connected between the ground voltage VSS terminal and a node D corresponding to the sub-bitline SBL, has a gate to receive the reference intput signal REF_EQ. When the reference input signal REF_EQ is activated, the NMOS transistor N7 initializes the node D corresponding to the sub-bitline SBL shown in FIG. 6 to a ground level.

The nonvolatile ferroelectric capacitor FC1 is connected between a plate reference voltage control signal REF_PL terminal and the node D. The nonvolatile ferroelectric capacitor FC1 corresponds to a cell capacitor of the cell C shown in FIG. 6, and outputs a voltage having a linear charge stored in the capacitor into the node D in response to a plate reference voltage control signal REF_PL.

The first path controller 40 comprises an NMOS transistor N8. The NMOS transistor N8, connected between the node D and the second reference voltage controller 50, has a gate to receive the register control signal RE_m.

The second path controller 70 comprises an NMOS transistor N9. The NMOS transistor N9, connected between an external control signal EXT_PAD terminal and the second reference voltage controller 50, has a gate to receive the register control signal REB_m.

The register control signal RE_m which has an opposite phase to the register control signal REB_m activates one of the first path controller 40 and the second path controller 70.

When the first path controller 40 is activated, a signal generated from the first reference voltage controller 30 becomes the reference voltage control signal REFSN. On the other hand, when the second path controller 70 is activated, the external control signal EXT_PAD becomes the reference voltage control signal REFSN.

The reference register unit 60 activates the second path controller 70 during a memory cell array test, and tests data characteristics of the memory cell array while changing a voltage level of the external control signal EXT_PAD. On the other hand, the reference register unit 60 activates the first path controller 40 during the normal operation, and uses an internally generated output voltage of the first reference voltage controller 30 for driving a chip.

Figure 8:
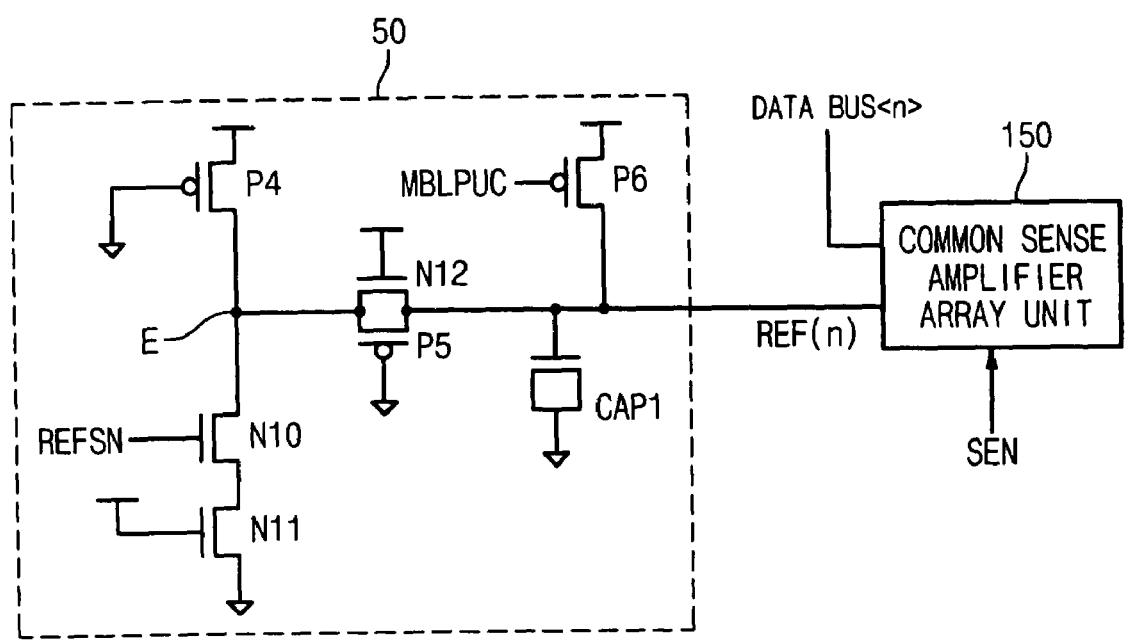
FIG. 8 is a circuit diagram illustrating a second reference voltage controller of FIG. 1.

FIG. 8 is a circuit diagram illustrating the second reference voltage controller 50 in the reference voltage controller 80 of FIG. 1.

The second reference voltage controller 50 comprises devices corresponding to elements of the cell array block 10 shown in FIGS. 3 to 6.

An input node of the reference voltage control signal REFSN corresponds to the sub-bitline SBL. A node E corresponds to the main bitline MBL.

An NMOS transistor N10, connected between the node E and an NMOS transistor N11, has a gate to receive the reference voltage control signal REFSN. The NMOS transistor N10 corresponds to the NMOS transistor N3 in the sub cell array 13 of FIG. 6.

A PMOS transistor P4, connected between the power voltage terminal and the node E, has a gate to receive a ground voltage so that the PMOS transistor P4 is maintained at a turn-on state. The PMOS transistor P4 corresponds to the PMOS transistor P2 in the MBL load controller 12 of FIG. 4.

The NMOS transistor N11, connected between the NMOS transistor N10 and the ground voltage terminal, has a gate to receive the power voltage so that the NMOS transistor N11 is maintained at a turn-on state. The NMOS transistor N11 corresponds to the NMOS transistor N2 in the sub cell array 13 of FIG. 6.

An NMOS transistor N12 and a PMOS transistor P5 are connected between the node E and an output terminal. The NMOS transistor N12 has a gate to receive the power voltage, and the PMOS transistor P5 has a gate to receive the ground voltage. Here, the NMOS transistor N12 and the PMOS transistor P5 correspond to the NMOS transistor N1 and the PMOS transistor P3 in the column selecting controller 14 of FIG. 5.

A capacitor CAP1 corresponds to a RC delay element of the data bus unit 20. A PMOS transistor P6, connected between the power voltage terminal and the output terminal, has a gate to receive the main bitline pull-up control signal MBLPUC. A PMOS transistor P6 corresponds to the PMOS transistor P1 in the MBL pull-up controller 11 of FIG. 3.

A reference voltage REF(n) outputted from the above-described second reference voltage controller 50 and a signal outputted from the data but unit 20 are inputted into the common sense amplifier array unit 150.

The second reference voltage controller 50 performs a test under the same condition as that of the cell array block 10 to evaluate characteristics of the chip precisely and rapidly.

Figure 9:
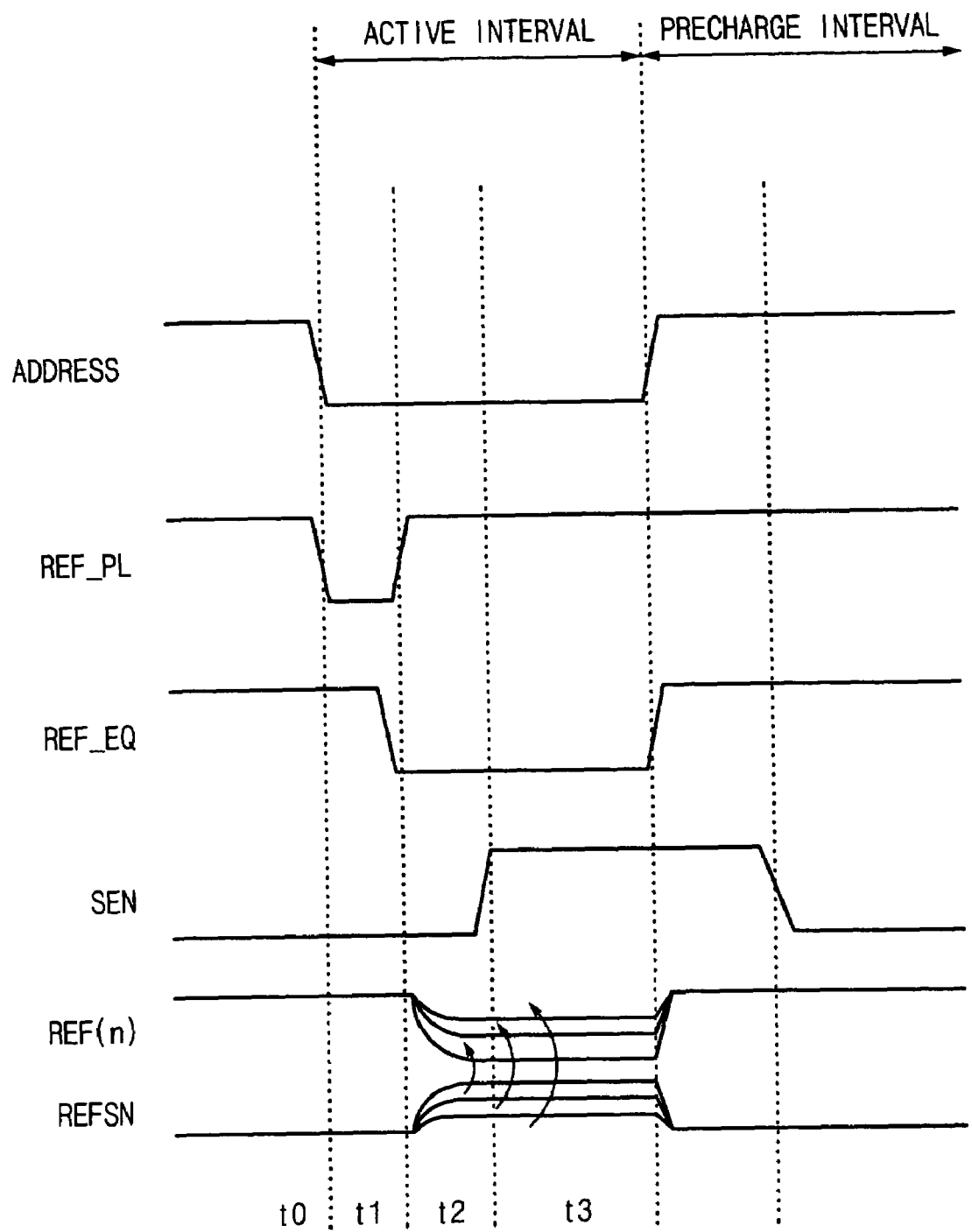
FIG. 9 is a timing diagram illustrating the operation of the reference voltage controller of FIG. 1.

FIG. 9 is a timing diagram illustrating the operation of the reference voltage controller 80 of FIG. 1.

In an interval t1, when an active interval starts, an address is inputted. During the interval t1, the plate reference voltage control signal REF_PL is disabled to a low level.

In an interval t2, if the reference input signal REF_EQ is disabled to a low level, reference charges are charged in the nonvolatile ferroelectric capacitor FC1 to generate n reference voltages REF(n).

When the first path controller 40 is activated, an output voltage of the first reference voltage controller 30 becomes the voltage level of the reference voltage control signal REFSN. The voltage level of one reference voltage control signal REFSN is determined by the size of the nonvolatile ferroelectric capacitor FC1. The levels of reference voltages REF(n) are determined depending on the voltage level of the reference voltage control signal REFSN.

When the reference voltage level is changed in the test of the cell array block 10, the second path controller 70 is activated. As a result, the voltage level of the external control signal EXT_PAD becomes that of the reference voltage control signal REFSN.

A plurality of voltage levels of the external control signal EXT_PAD are generated, and a plurality of voltage levels of the reference voltage control signal REFSN are generated. AS a result, the voltage level of the reference voltage REF(n) is determined.

Figure 10:
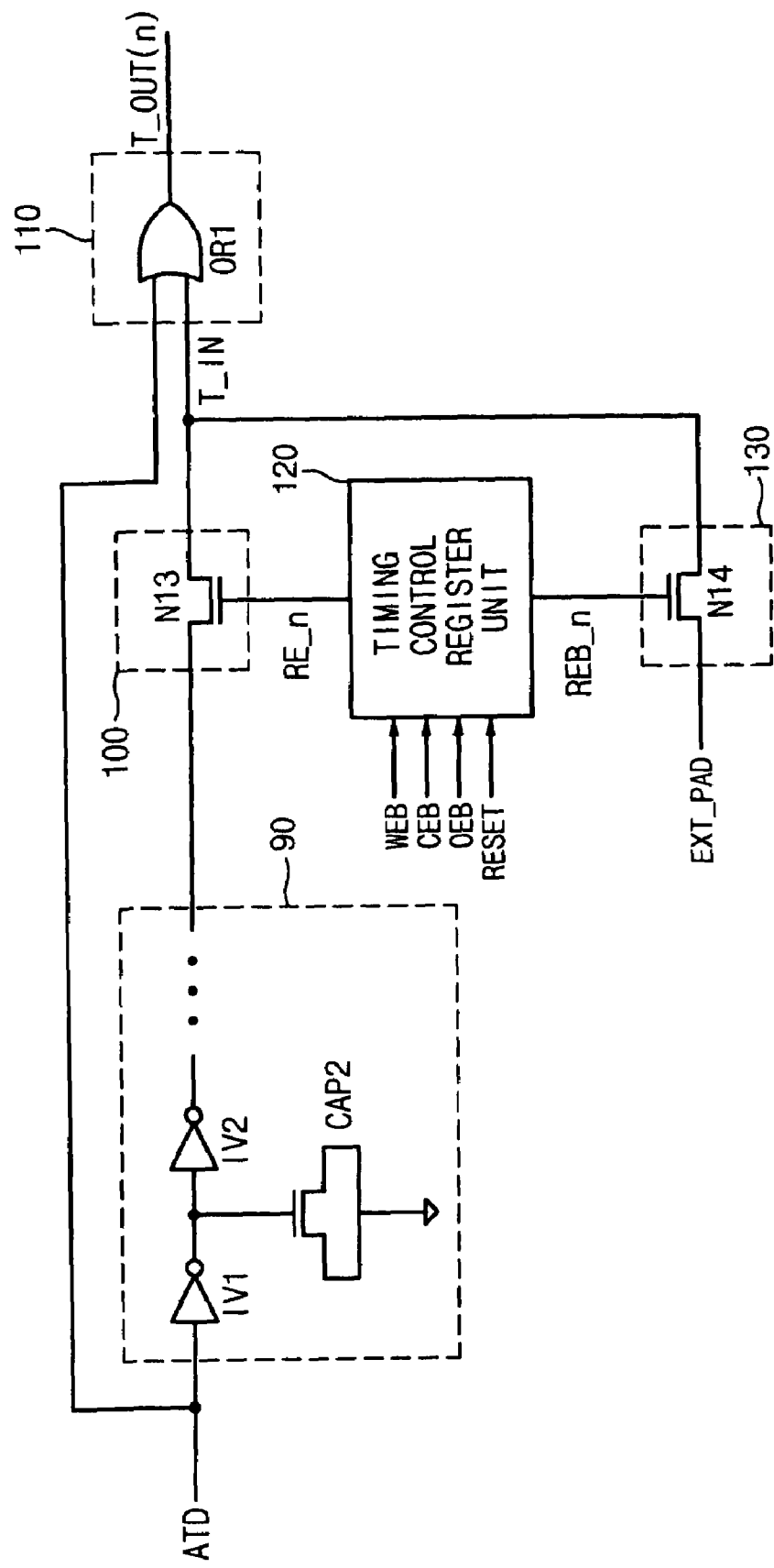
FIG. 10 is a circuit diagram illustrating a timing controller of FIG. 1.

FIG. 10 is a circuit diagram illustrating the timing controller 140 of FIG. 1.

The first timing controller 90 comprises inverters IV1 and IV2 for delaying the address transition detecting signal ATD, and a delay capacitor CAP2.

The third path controller 100 comprises an NMOS transistor N13. The NMOS transistor N13, connected between the first timing controller 90 and the second timing controller 100, has a gate to receive the register control signal RE_n.

The fourth path controller 130 comprises an NMOS transistor N14. The NMOS transistor N14, connected between the external control signal EXT_PAD terminal and the second timing controller 110, has a gate to receive the register control signal REB_n.

The register control signal RE_n has an opposite phase to the register control signal REB_n. These register control signals RE_n and REB_n activate one of the third path controller 100 and the fourth path controller 130.

When the third path controller 100 is activated, a signal generated from the first timing controller 90 becomes a timing control signal T_IN. When the fourth path controller 130 is activated, the external control signal EXT_PAD becomes the timing control signal T_IN.

The second timing controller 110 comprises an OR gate OR1. The OR gate OR1 selects one signal of the output signals from the third path controller 100 and the fourth path controller 130, and outputs a timing control signal T_OUT (n) into the common sense amplifier array unit 150.

The timing control register unit 120 activates the fourth path controller 130 during the memory cell array test, and directly tests data characteristics of the memory cell array while changing a voltage level of the external control signal EXT_PAD. On the other hand, the timing control register unit 120 activates the third path controller 100 during the normal operation, and uses an output signal from the first timing controller 90 for driving the chip.

Figure 11:
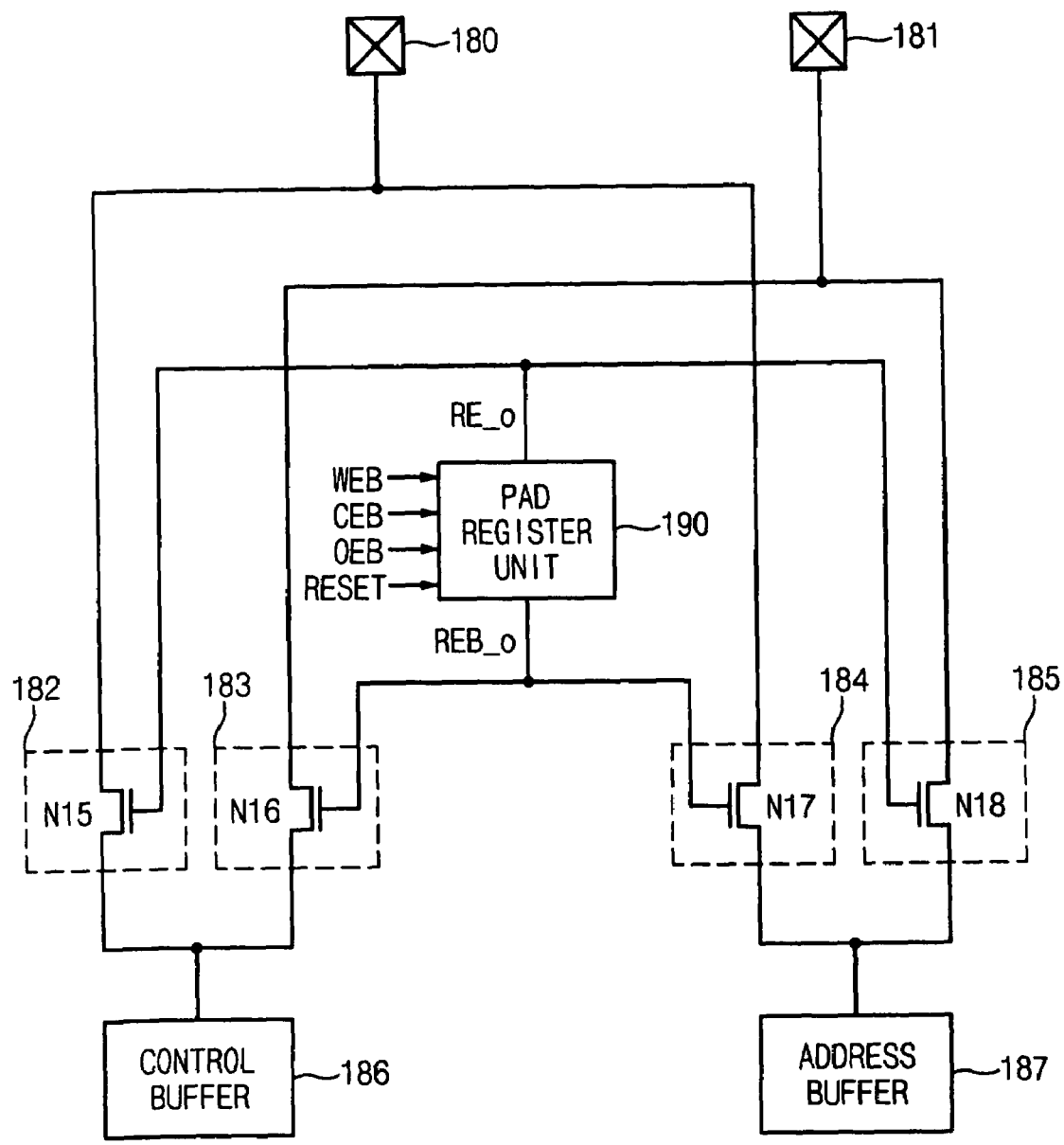
FIG. 11 is a block diagram illustrating a test mode control device using a nonvolatile ferroelectric memory according to another embodiment of the present invention.

FIG. 11 is a block diagram illustrating a test mode control device using a nonvolatile ferroelectric memory according to another embodiment of the present invention.

In another embodiment, the test mode control device comprises a control pad 180, an address pad 191, fifth to eighth path controllers 182~185, a control buffer 186, an address buffer 187 and a pad register unit 190.

The pad register unit 190 outputs register control signals RE_o and REB_o in response to a write enable signal WEB, a chip enable signal CEB, an output enable signal OEB and a reset signal RESET.

The fifth path controller 182 comprises an NMOS transistor N15. The NMOS transistor N15, connected between the control pad 180 and the control buffer 186, has a gate to receive the register control signal RE_o. The sixth path controller 183 comprises an NMOS transistor N16. The NMOS transistor N16, connected between the address pad 181 and the control buffer 186, has a gate to receive the register control signal REB_o.

The seventh path controller 184 comprises an NMOS transistor N17. The NMOS transistor N17, connected between the control pad 180 and the address buffer 187, has a gate to receive the register control signal REB_o. The eighth path controller 185 comprises an NMOS transistor N18. The NMOS transistor N18, connected between the address pad 181 and the address buffer 187, has a gate to receive the register control signal RE_o.

Here, one of the fifth path controller 182 and the sixth path controller 183 is selectively activated, and one of the seventh path controller 184 and the eighth path controller 185 is selectively activated.

When the fifth path controller 182 and the eighth path controller 185 are activated, the control pad 180 is assigned to the control buffer 186, and the address pad 181 is assigned to the address buffer 187.

On the other hand, when the sixth path controller 183 and the seventh path controller 184 are activated, the control pad 180 is assigned to the address buffer 187, and the address pad 181 is assigned to the control buffer 186.

The test mode control device is used to change a pin function of pads differently in the plurality of control pads 180 and the plurality of address pads 181.

For example, when a user intends to change the pin assignment of the control pad 180 and the address pad 181, the control pad 180 is assigned to the address buffer 187, and the address pad 181 is assigned to the control buffer 186. The original control pad 180 becomes the address pad 181, and the original address pad 181 becomes the control pad 180.

In addition, the test mode control device is used for rearrangement of pads in a general chip with programmed command signals as well as in a test mode.

Figure 12:
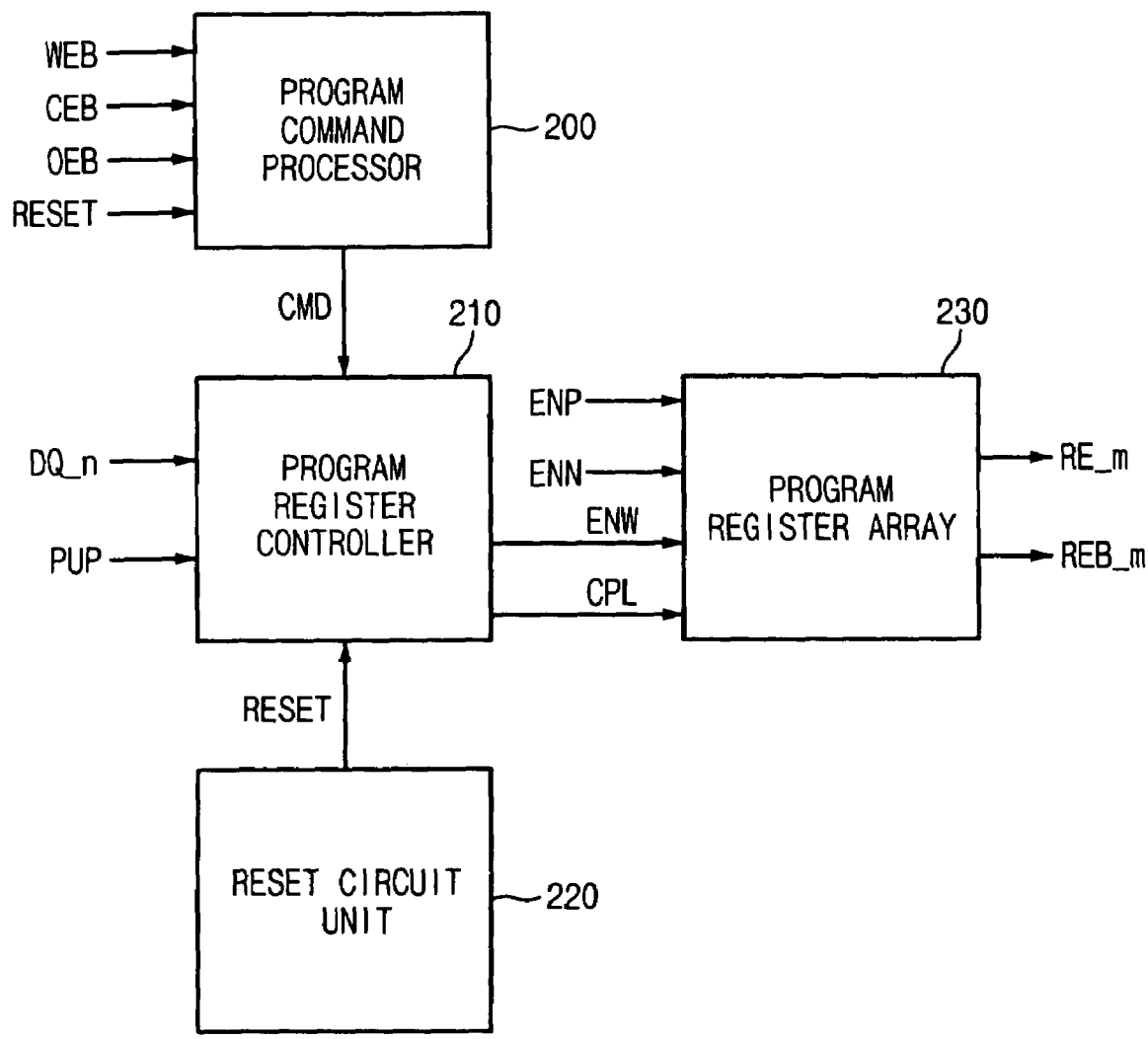
FIG. 12 is a diagram illustrating a reference register unit, a timing control register unit and a pad register unit according to an embodiment of the present invention.

FIG. 12 is a diagram illustrating the reference register unit 60, the timing control register unit 120 and the pad register unit 190 of FIGS. 1 and 11.

Since the reference register unit 60 has the same structure as that of the timing control register unit 120 and the pad register unit 190, the reference register unit 60 is described hereinafter.

The reference register unit 60 comprises a program command processor 200, a program register controller 210, a reset circuit unit 220 and a program register array 230.

The program command processor 200 codes a program command in response to a write enable signal WEB, a chip enable signal CEB, an output enable signal OEB and a reset signal RESET, and outputs a command signal CMD.

The program register control unit 210 logically combines a command signal CMD, a power-up detecting signal PUP and input data DQ_n, and outputs a write control signal ENW and a cell plate signal CPL.

The program register array 230 outputs reference control signals RE_m and REB_m in response to a pull-up enable signal ENP, a pull-down enable signal ENN, a write control signal ENW and a cell plate signal CPL.

The reset circuit unit 220 outputs a reset signal RESET for initializing a register in a power-up mode into the program register controller 210.

If the command signal CMD is outputted from the program command processor 200, the program register controller 210 changes or sets configuration data of the program register array 230.

The reset circuit unit 220 outputs the reset signal RESET in the power-up mode to activate the program register controller 210. Control signals outputted from the program register controller 210 initialize nonvolatile data of the program register array 230.

Figure 13:
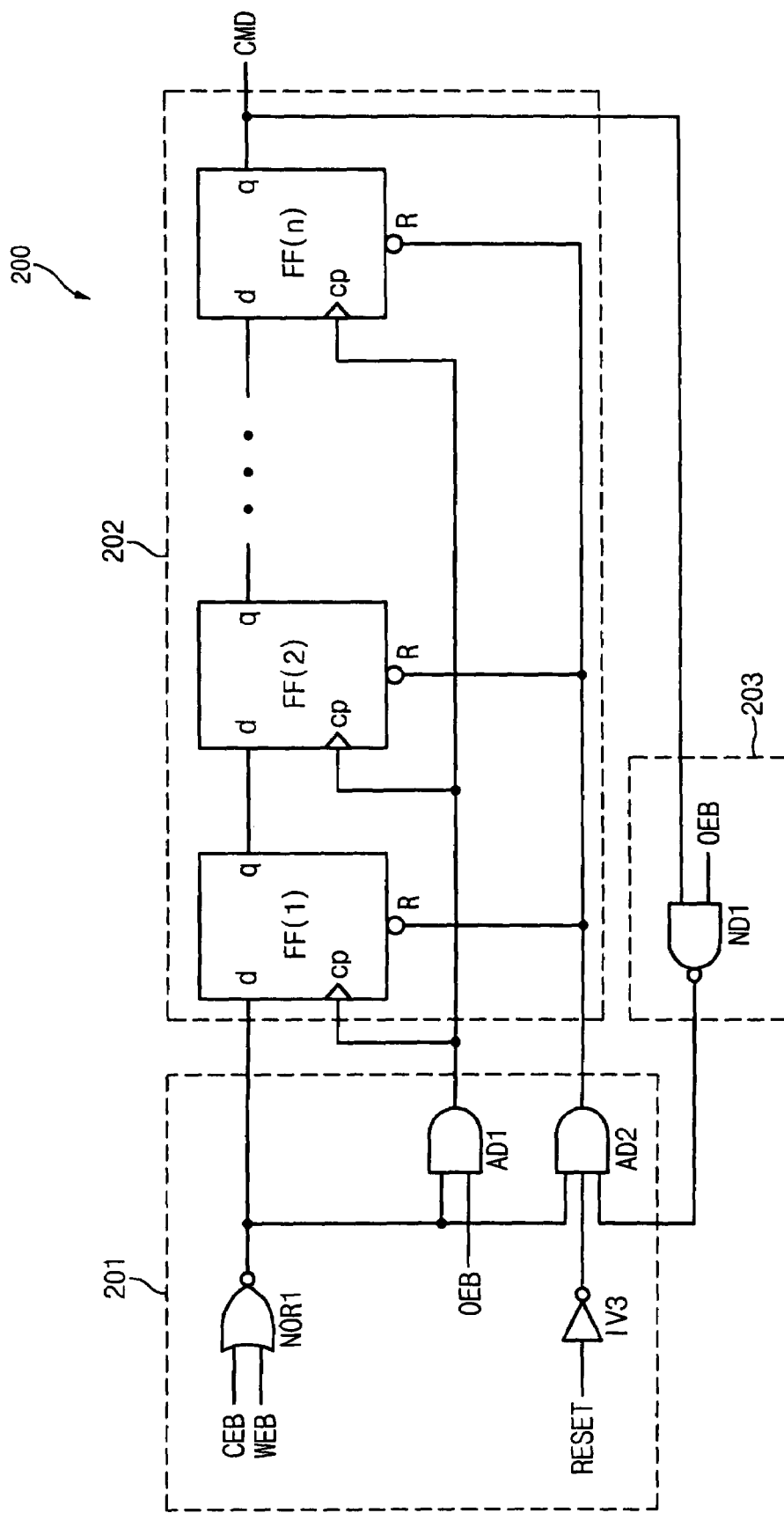
FIG. 13 is a diagram illustrating a program command processor of FIG. 12.

FIG. 13 is a diagram illustrating the program command processor 200 of FIG. 12.

The program command processor 200 comprises a logic unit 201, a flip-flop unit 202 and an overtoggle detecting unit 203.

The logic unit 201 comprises an NOR gate NOR1, AND gates AD1 and AD2, and an inverter IV3. The NOR gate NOR1 performs an NOR operation on the write enable signal WEB and the chip enable signal CEB. The AND gate AD1 performs an AND operation on an output signal from the NOR gate NOR1 and the output enable signal OEB. The AND gate AD2 performs an AND operation on the output signal from the NOR gate NOR1, the reset signal RESET inverted by the inverter IV3 and an output signal from the overtoggle detecting unit 203.

The flip-flop unit 202 comprises a plurality of flip-flops FF having input nodes d and output nodes q connected in series. The output signal from the NOR gate NOR1 is inputted into the input node d, and the command signal CMD is outputted from the output node q. Each flip-flop FF comprises a node cp to receive an activation synchronizing signal from the AND gate AD1 and a reset node R to receive a reset signal from the AND gate AD2.

When the chip enable signal CEB and the write enable signal WEB are at a low level, the output enable signal OEB is inputted into the node cp of the flip-flop FF. The reset node R of the flip-flop FF receives a low signal to be reset if one of the chip enable signal CEB and the write enable signal WEB is at a high level. The flip-flop FF is reset in an interval where the reset signal RESET is at a high level in the power-up mode.

The overtoggle detecting unit 203 comprises an NAND gate ND1 for performing an NAND operation on the command signal CMD and the output enable signal OEB. The overtoggle detecting unit 203 resets the flip-flop unit 202 when the output enable signal OEB exceeds n toggles to cause overtoggle. The number of toggles is set to be different in the program command processor 200.

Figure 14:
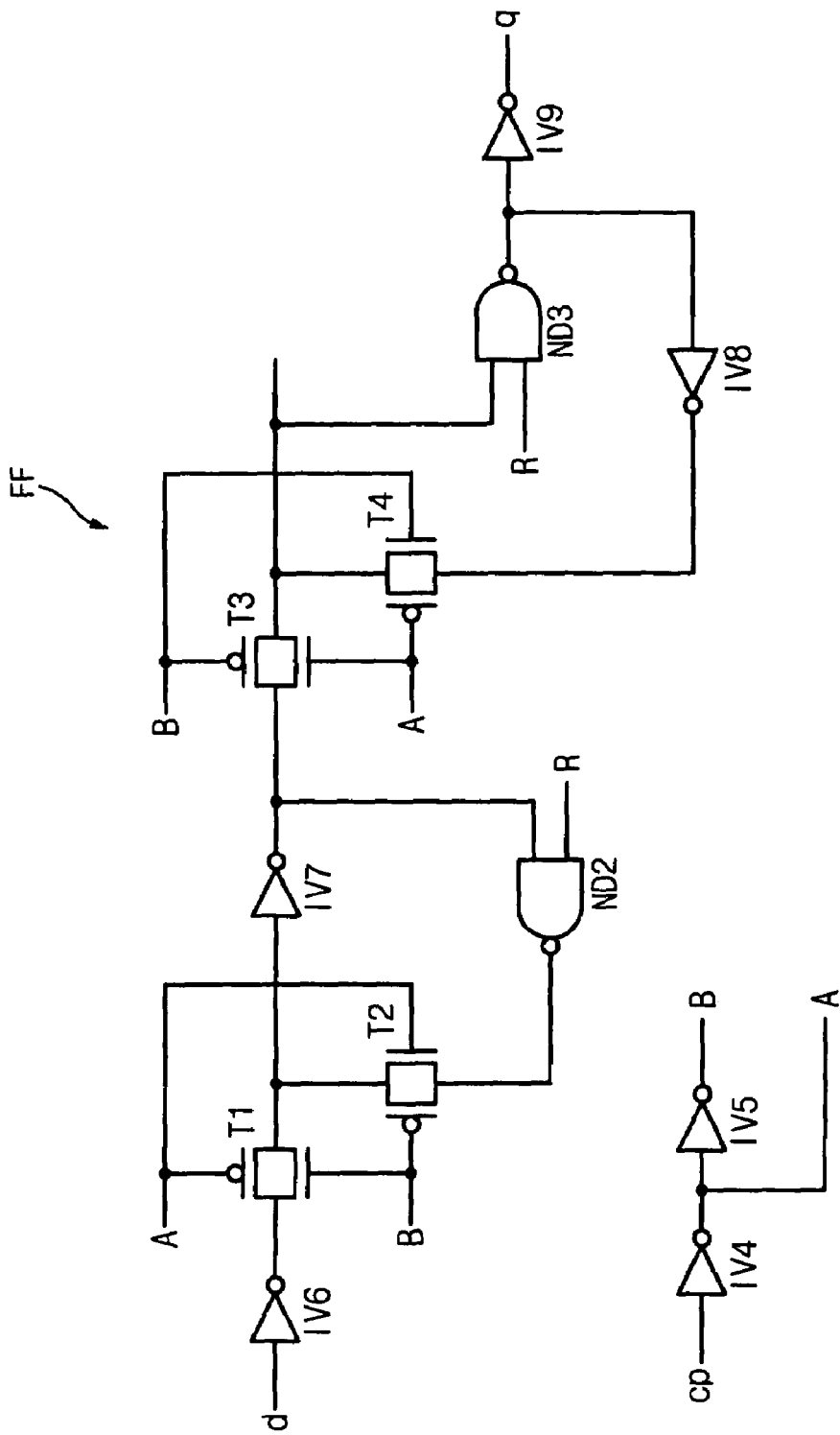
FIG. 14 is a circuit diagram illustrating a flip-flop of FIG. 13.

FIG. 14 is a circuit diagram illustrating the flip-flop FF of FIG. 13.

The flip-flop FF comprises transmission gates T1~T4, NAND gates ND2 and ND3, and inverters IV4~IV9. The inverter IV4 inverts an output signal from the node cp to output a control signal A. The inverter IV5 inverts an output signal from the inverter IV4 to output a control signal B.

The transmission gate T1 selectively outputs an output signal from the inverter IV6 depending on states of the control signals A and B. The NAND gate ND2 performs an NAND operation on an output signal from the inverter IV7 and an output signal from the reset node R, and outputs the NAND operation result into the transmission gate T2. The transmission gate T2 selectively outputs an output signal from the NAND gate ND2 depending on the states of the control signals A and B.

The transmission gate T3 selectively outputs an output signal from the inverter IV7 depending on the states of the control signal A and B. The NAND gate ND3 performs an NAND operation on output signals from the transmission gate T3 and from the reset node R. The inverter IV8 inverts an output signal from the NAND gate ND3, and outputs the inverted signal into the transmission gate T4.

The transmission gate T4 selectively outputs an output signal from the inverter IV8 depending on the states of the control signals A and B. The inverter IV9 inverts an output signal from the NAND gate ND3, and outputs the inverted signal into the output node q.

Data inputted from the input node d moves rightward whenever a control signal inputted through the node cp toggles once. When a low level signal is inputted into the reset node R, a low level signal is outputted from the output node q, thereby resetting the flip-flop FF.

Figure 15:
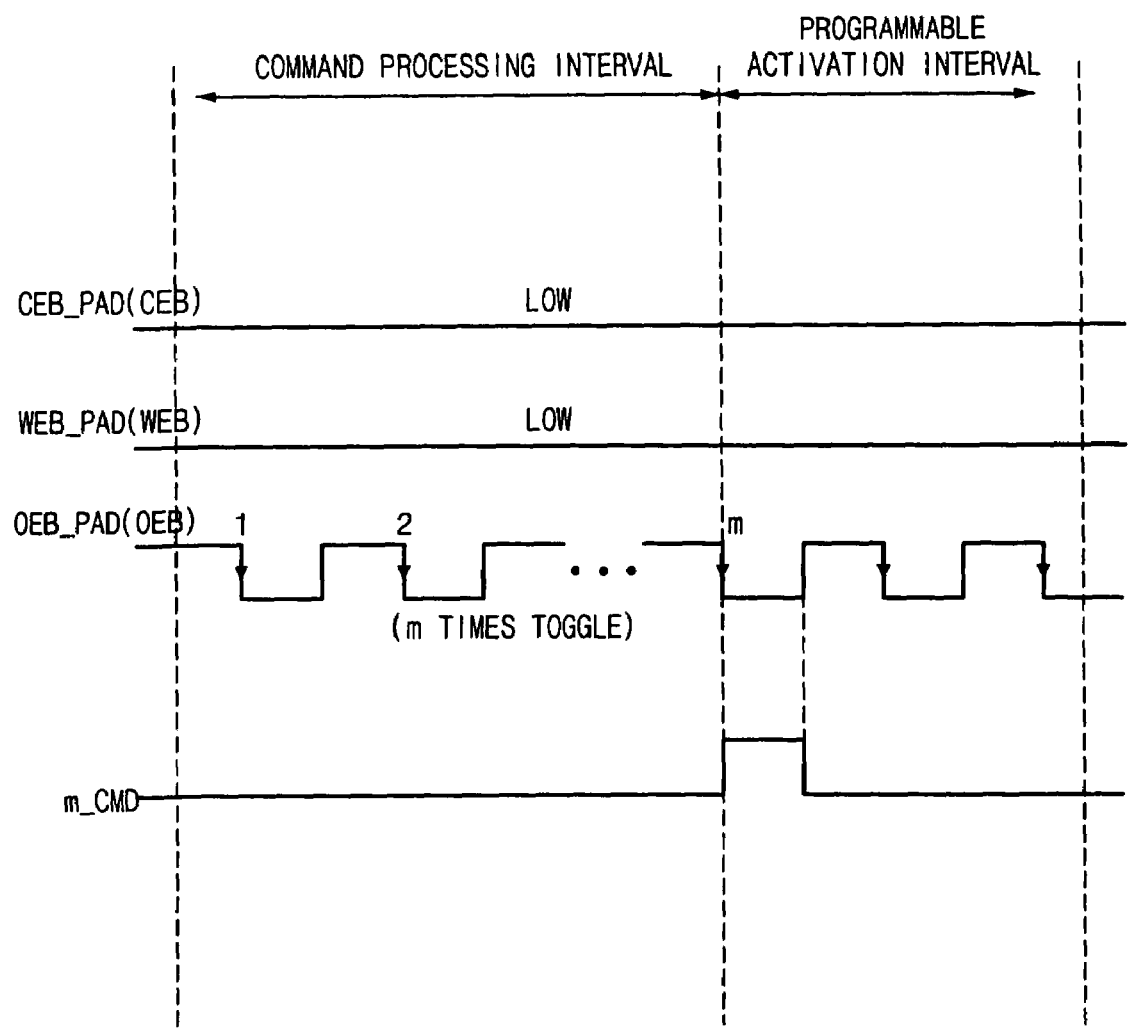
FIG. 15 is a timing diagram illustrating the operation of the program command processor in the reference register unit.

FIG. 15 is a timing diagram illustrating the operation of the program command processor 200 in the reference register unit 60 of FIG. 1.

In a command processing interval, the chip enable signal CEB and the write enable signal WEB are maintained at a low level. While the output enable signal OEB toggles m times, the command signal CMD is maintained at a disabled state.

When a programmable activation interval starts, if the output enable signal OEB toggles m times, the command signal CMD is enabled to a high level. When the number of toggle of the output enable signal OEB is regulated, the number of flip-flops FF is regulated. When the output enable signal OEB toggles over m times in the programmable activation interval, the command signal CMD is disabled again.

Figure 16:
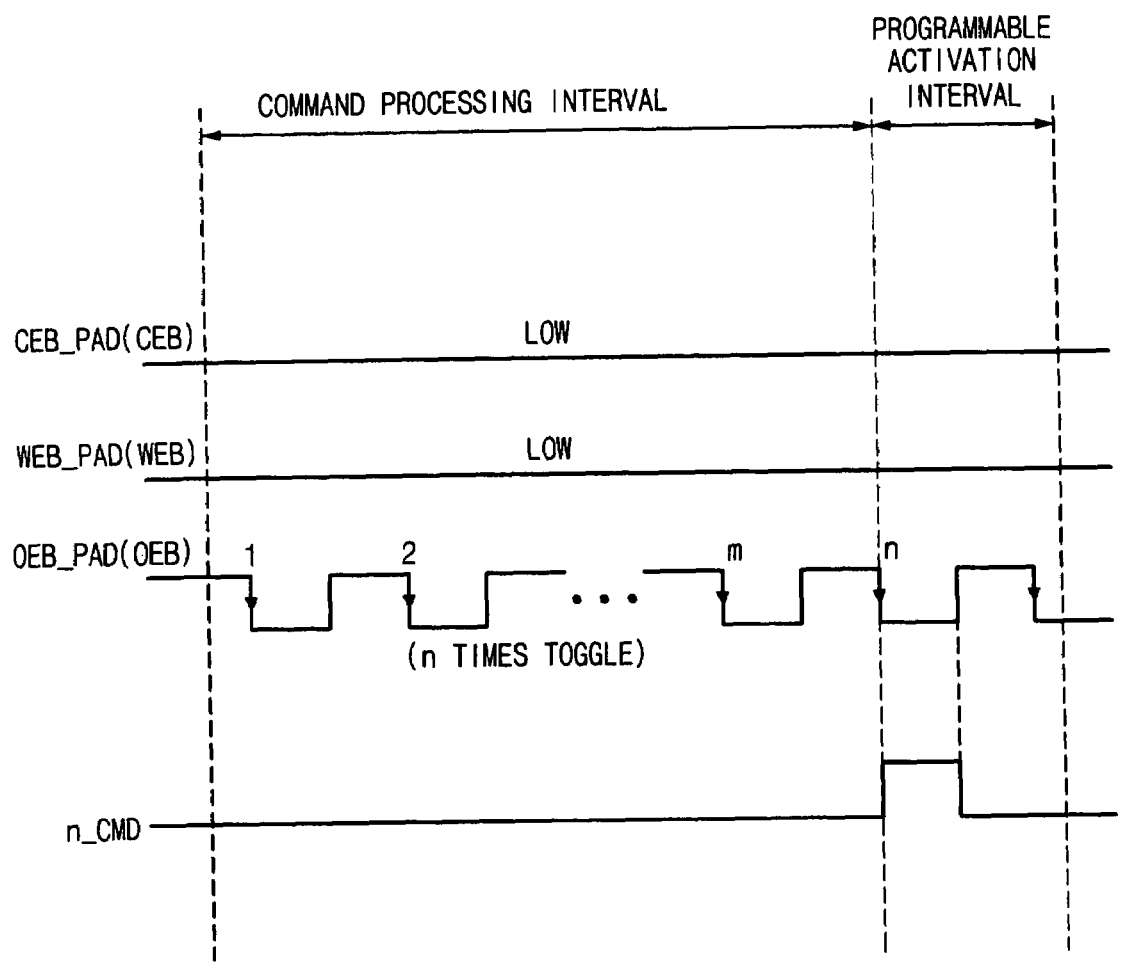
FIG. 16 is a timing diagram illustrating the operation of the program command processor in the timing control register unit.

FIG. 16 is a timing diagram illustrating the operation of the program command processor 200 in the timing control register unit 120 of FIG. 1.

In a command processing interval, the chip enable signal CEB and the write enable signal WEB are maintained at a low level. While the output enable signal OEB toggles n times, the command signal CMD is maintained at a disabled state.

Thereafter, when an programmable activation interval starts, the output enable signal OEB toggles n times, the command signal CMD is enabled to a high level. When the number of toggle of the output enable signal OEB is regulated, the number of flip-flops FF connected in series is regulated. However, when the output enable signal OEB toggles over n times in the programmable activation interval, the command signal CMD is disabled again.

Figure 17:
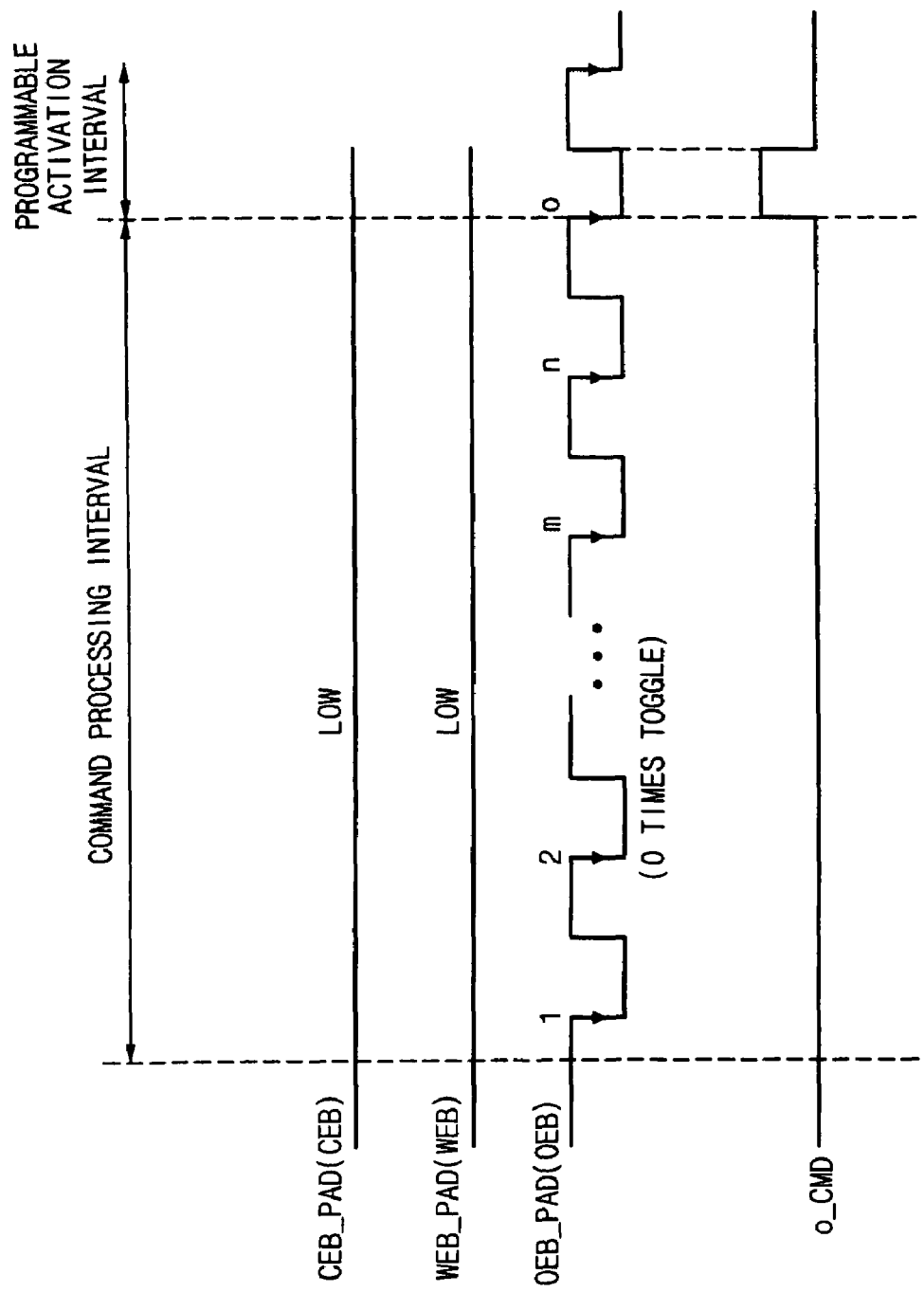
FIG. 17 is a timing diagram illustrating the operation of the program command processor in the pad register unit.

FIG. 17 is a timing diagram illustrating the operation of the program command processor 200 in the pad register unit 190 of FIG. 11.

In a command processing interval, the chip enable signal CEB and the write enable signal WEB are maintained at a low level. While the output enable signal OEB toggles o times, the command signal CMD is maintained at a disabled state.

When a programmable activation interval starts, if the output enable signal OEB toggles o times, the command signal CMD is enabled to a high level. When the number of toggle of the output enable signal OEB is regulated, the number of flip-flops FF connected in series is regulated. In the programmable activation interval, when the output enable signal OEB toggles over o times, the command signal CMD is disabled again.

Figure 18:
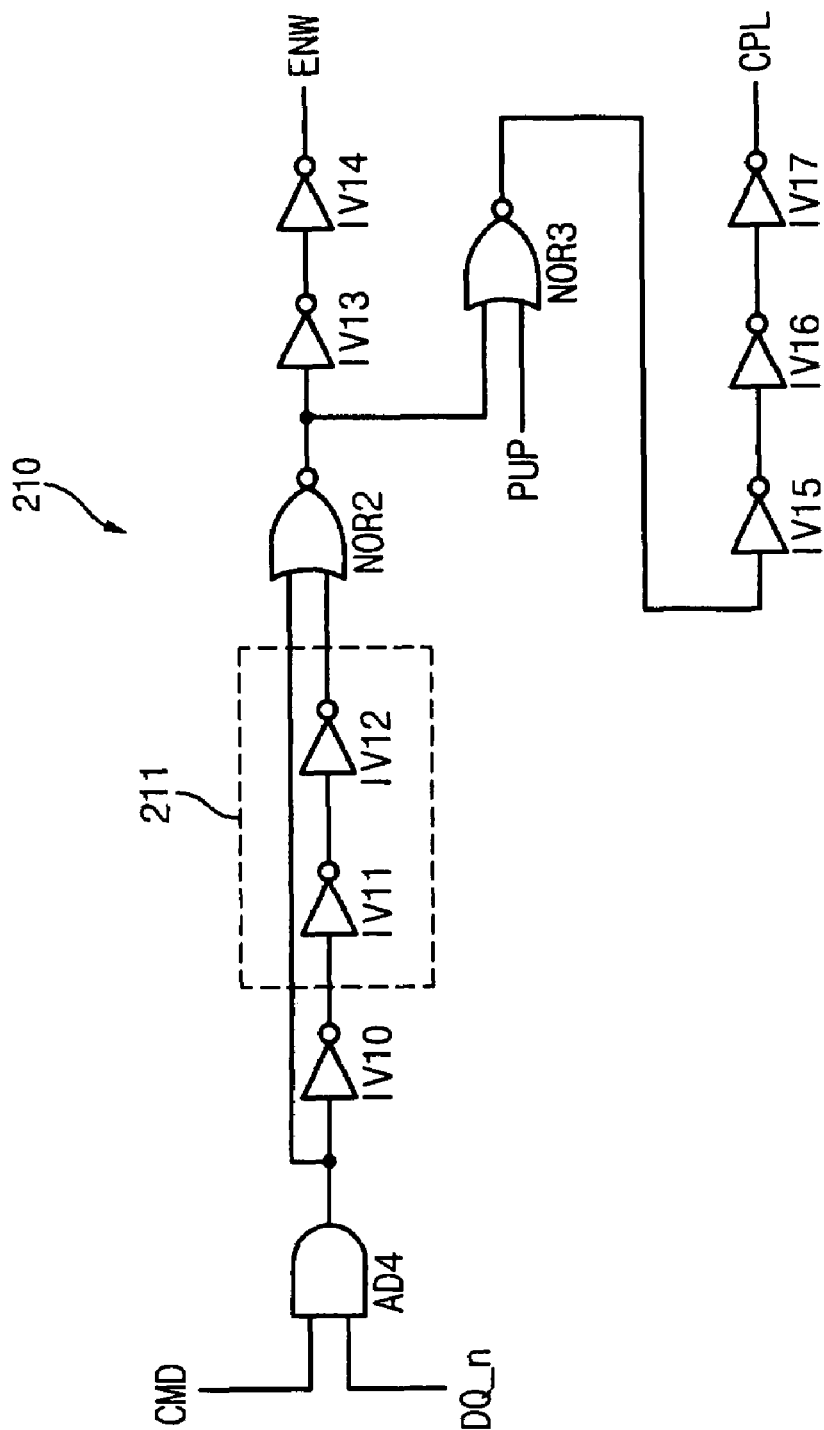
FIG. 18 is a circuit diagram illustrating a program register controller of FIG. 12.

FIG. 18 is a circuit diagram illustrating the program register controller 210 of FIG. 12.

The program register controller 210 comprises an AND gate AD4, inverters IV10~IV17, and NOR gates NOR2 and NOR3.

The AND gate AD4 performs an AND operation on the nth command signal CMD and input data DQ_n. The inverters IV10~IV12 invert and delay an output signal from the AND gate AD4. The NOR gate NOR2 performs an NOR operation on output signals from the AND gate AD4 and the inverter IV12. The inverters IV13 and IV14 delay an output signal from the NOR gate NOR2, and outputs the write control signal ENW.

The NOR gate NOR3 performs an NOR operation on the output signal from the NOR gate NOR2 and the power-up detecting signal PUP. The inverters IV15~IV17 invert and delay an output signal from the NOR gate NOR3, and outputs the cell plate signal CPL. The power-up detecting signal PUP is a control signal to read data stored in a register in the initial reset operation and to reset the register.

If the data DQ_n is toggled by using an input pad after the nth command signal CMD is activated to a high level, the write control signal ENW and the cell plate signal CPL which have a pulse width for a delay time of the delay unit 211 are generated.

Figure 19:
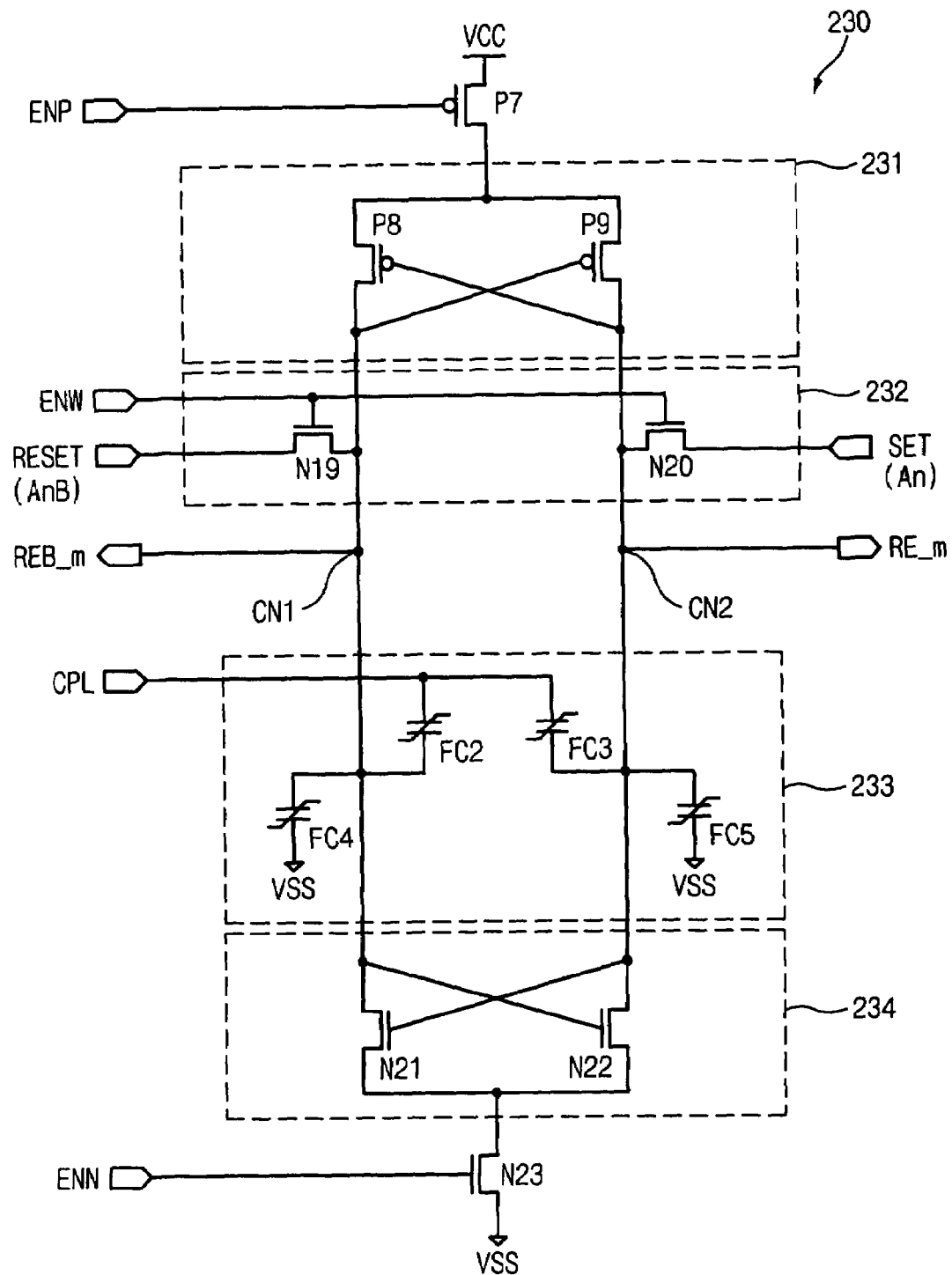
FIG. 19 is a circuit diagram illustrating a program register array of FIG. 12.

FIG. 19 is a circuit diagram illustrating the program register array 230 of FIG. 12.

The program register array 230 comprises a pull-up driver (PMOS transistor P7), a first driving unit 231, a write enable controller 232, a ferroelectric capacitor unit 233, a second driving unit 234 and a pull-down driver (NMOS transistor N23).

The PMOS transistor P7, connected between the power voltage VCC terminal and the first driving unit 231, has a gate to receive the pull-up enable signal ENP.

The first driving unit 231 comprises PMOS transistors P8 and P9 with a latch structure. The PMOS transistor P8 has a gate connected to a drain of the PMOS transistor 9 while the PMOS transistor P9 has a gate connected to a drain of the PMOS transistor 8.

The write enable controller 232 comprises. NMOS transistors N19 and N20. The NMOS transistor N19, connected between the reset signal RESET input terminal and a node CN1, has a gate to receive the write control signal ENW. The NMOS transistor N20, connected between a set signal SET input terminal and a node CN2, has a gate to receive the write control signal ENW.

The ferroelectric capacitor unit 233 comprises ferroelectric capacitors FC2~FC5. The ferroelectric capacitor FC2 has one terminal connected to the node CN1 and the other terminal to receive the cell plate signal CPL. The ferroelectric capacitor FC3 has one terminal connected to the node CN2 and the other terminal to receive the cell plate signal CPL.

The ferroelectric capacitor FC4 is connected between the node CN1 and the ground voltage terminal, and the ferroelectric capacitor FC5 is connected between the node CN2 and the ground voltage terminal. Here, the ferroelectric capacitors FC4 and FC5 may be selectively added depending on loading level control of both terminals of the cell.

The second driving unit 234 comprises NMOS transistors N21 and N22 with a latch structure. The NMOS transistor N21 has a gate connected to a drain of the NMOS transistor N22 while the NMOS transistor N22 has a gate connected to a drain of the NMOS transistor N21.

The NMOS transistor N23, connected between the second driving unit 234 and the ground voltage VSS terminal, has a gate to receive the pull-down enable signal ENN. The program register array 230 outputs the control signals RE_m and REB_m.

Figure 20:
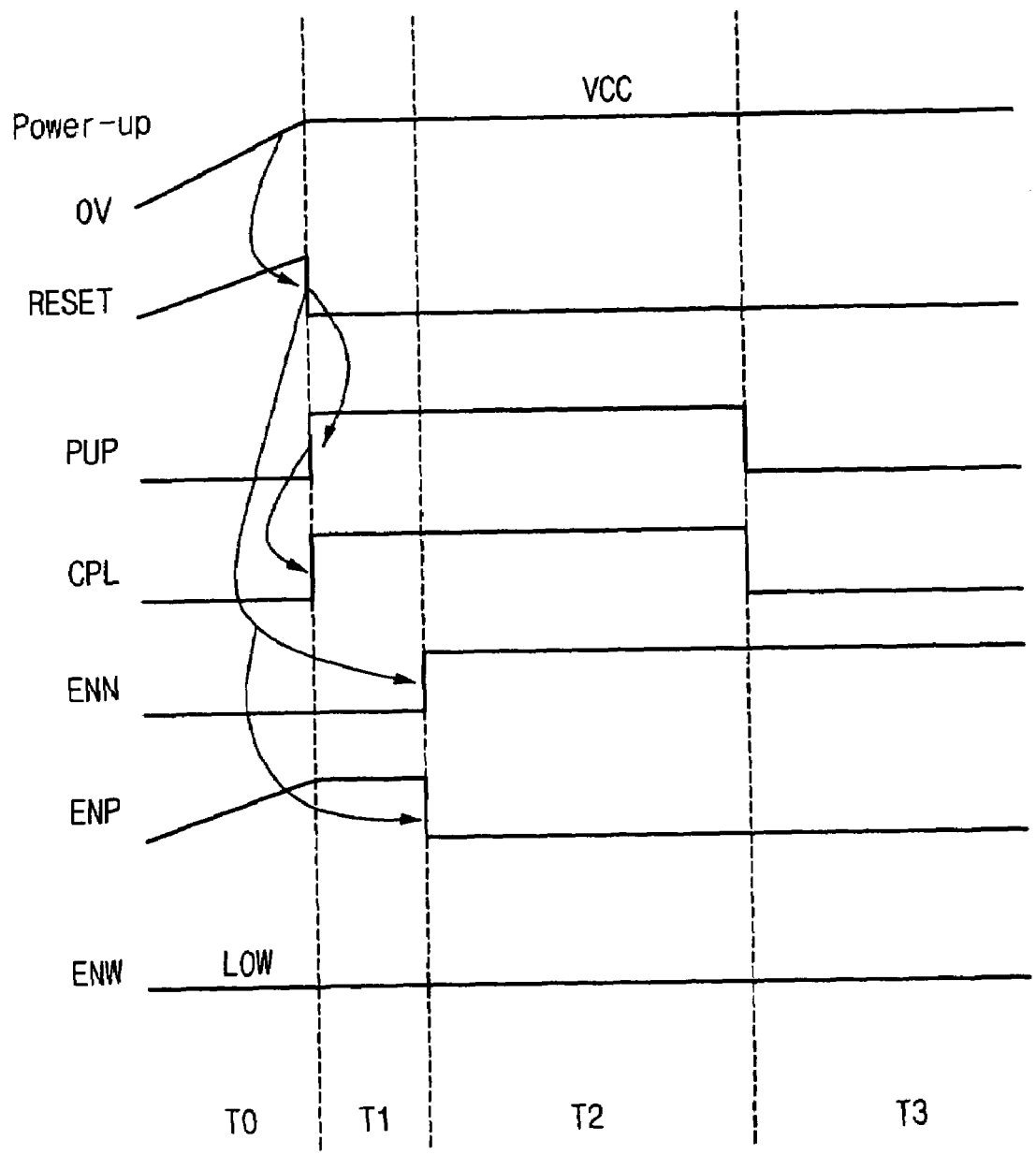
FIG. 20 is a timing diagram illustrating the operation in a power-up mode according to an embodiment of the present invention.

FIG. 20 is a timing diagram illustrating the read operation of data stored in the program cell in a power-up mode according to an embodiment of the present invention.

After the power-up mode, if power reaches a stable power voltage VCC level in an interval T1, the reset signal RESET is disabled and the power-up detecting signal PUP is enabled.

Thereafter, as the power-up detecting signal PUP is enabled, the cell plate signal CPL transits to a high level. Charges stored in the ferroelectric capacitors FC2 and FC3 of the program register array 230 generate voltage difference between the nodes CN1 and CN2 by capacitance load of the ferroelectric capacitors FC4 and FC5.

If an interval T2 starts where sufficient voltage difference is generated in the nodes CN1 and CN2, the pull-down enable signal ENN is enabled to a high level, the pull-up enable signal ENP is disabled to a low level. As a result, data of both nodes are amplified.

Thereafter, if an interval T3 starts and amplification of data is completed, the power-up detecting signal PUP and the cell plate signal CPL transits to the low level again. As a result, high data of the ferroelectric capacitor FC2 or FC3 is restored Here, the write control signal ENW is maintained at the low level to prevent external data from being rewritten.

Figure 21:
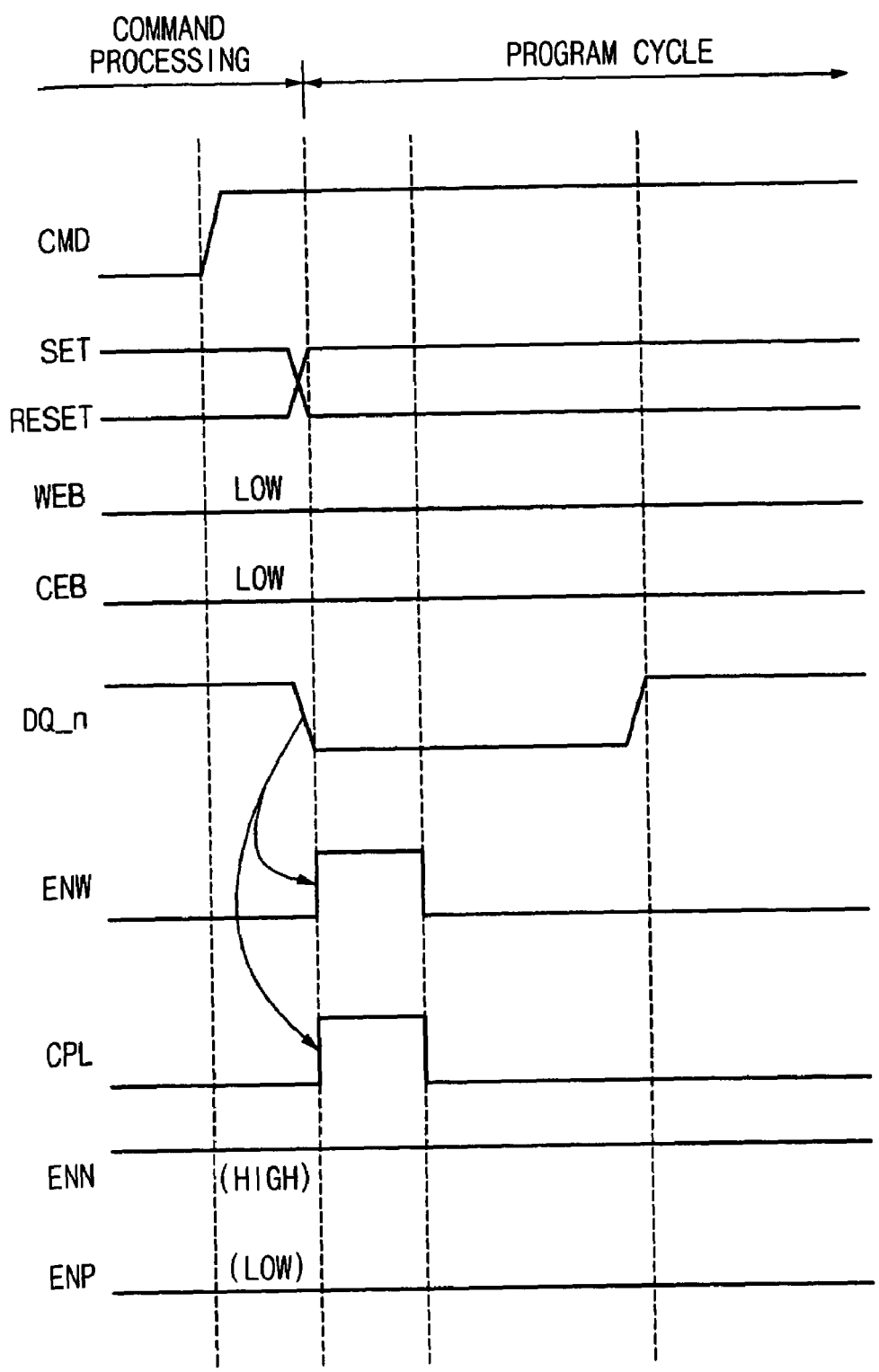
FIG. 21 is a timing diagram illustrating the operation in a program mode according to an embodiment of the present invention.

FIG. 21 is a timing diagram illustrating the operation where new data is set in the program register after the nth command signal CMD is activated to a high level in a program mode according to an embodiment of the present invention.

If a predetermined time passes after the nth command signal CMD is enabled to the high level, the set signal sET and the reset signal RESET are inputted. Then, when the input data DQ_n applied from the data input/output pad are disabled to a high to low level, the program cycle starts. As a result, the write control signal ENW to write new data in the register and the cell plate signal CPL transit to the high level.

The pull-down enable signal ENN is maintained at the high level, and the pull-up enable signal ENP is maintained at the low level. If the nth command signal CMD with a high level is inputted into the program register controller 210, input of signals from the program command processor 200 are prevented. As a result, the program operation can be performed while no more control commands are inputted.

The above-described embodiment of the present invention shows an example wherein the reference voltage and timing provided to the common sense amplifier array unit 150 is controlled during the memory cell test and the function of data pin in the input pad is changed. However, the present invention is not limited the particular forms disclosed. Rather, it may be used in change of test modes for controlling wordlines, platelines or latch.

Accordingly, in the test mode control device according to an embodiment of the present invention, additional cost resulting from masks added in the memory test can be reduced by using a programmable method by command signals, thereby enabling precise evaluation of chip characteristics within a short time.

What is claimed is:

1. A test mode control device using a nonvolatile ferroelectric memory, comprising:
   a first timing controller for controlling timing of an address transition detecting signal;
   a timing control register unit for programming a code to control timing of a cell array block driving control signal in a nonvolatile ferroelectric memory, and outputting a register control signal including information on a test mode or normal operation mode depending on the programmed code;
   a path control means for selectively outputting an external control signal inputted externally in the test mode in response to the register control signal, and selectively outputting an output signal from the first timing controller in the normal operation mode; and
   a second timing controller for controlling timing of the cell array block driving control signal in response to an output signal from the path control means.

2. The device according to claim 1, wherein the first timing controller comprises:
   an inverter chain for delaying the address transition detecting signal for a predetermined time; and
   a capacitor connected to each node of the inverter chain.

3. The device according to claim 1, wherein the path control means comprises:
   a third path controller for outputting an output signal from the first timing controller in response to a first register control signal activated in the normal operation mode; and
   a fourth path controller for outputting the external control signal in response to a second register control signal activated in the test mode.

4. The device according to claim 1, wherein the timing control register unit comprises:
   a program command processor for outputting a command signal to code a program command in response to a write enable signal, a chip enable signal, an output enable signal and a reset signal;
   a program register controller for performing a logic operation on input data, a power-up detecting signal and the command signal, and outputting a write control signal and a cell plate signal;
   a program register array comprising a nonvolatile ferroelectric memory device, for outputting the programmed code in response to a pull-up enable signal, a pull-down enable signal, the write control signal and the cell plate signal; and
   a reset circuit unit for outputting the reset signal into the program register controller in a power-up mode.

5. The device according to claim 1, wherein the second timing controller comprises an OR gate for performing an OR operation on the address transition detecting signal and an output signal from the path control means and for outputting the cell array block driving control signal.

* * * * *